United States Patent
Yoshino et al.

(10) Patent No.: US 9,416,445 B2
(45) Date of Patent: Aug. 16, 2016

(54) METHOD FOR TREATING INNER SURFACE OF CHLORINE TRIFLUORIDE SUPPLY PASSAGE IN APPARATUS USING CHLORINE TRIFLUORIDE

(75) Inventors: Yu Yoshino, Moriyama (JP); Kunihiko Koike, Moriyama (JP); Manabu Saeda, Moriyama (JP); Toshiki Manabe, Osaka (JP)

(73) Assignee: IWATANI CORPORATION, Osaka-Shi (JP)

( * ) Notice: Subject to any disclaimer, the term of this patent is extended or adjusted under 35 U.S.C. 154(b) by 0 days.

(21) Appl. No.: 14/374,728

(22) PCT Filed: Feb. 8, 2012

(86) PCT No.: PCT/JP2012/052862
§ 371 (c)(1),
(2), (4) Date: Jul. 25, 2014

(87) PCT Pub. No.: WO2013/118260
PCT Pub. Date: Aug. 15, 2013

(65) Prior Publication Data
US 2015/0041430 A1 Feb. 12, 2015

(51) Int. Cl.
- C03C 15/00 (2006.01)
- B05D 7/22 (2006.01)
- C23C 16/44 (2006.01)
- H01L 21/67 (2006.01)
- C23C 16/455 (2006.01)

(52) U.S. Cl.
CPC ......... C23C 16/4404 (2013.01); C23C 16/4405 (2013.01); C23C 16/45561 (2013.01); H01L 21/67069 (2013.01)

(58) Field of Classification Search
CPC ............ C23C 16/4405; C23C 16/4412; C23C 16/45561; C23C 16/24; C23C 16/405; C23C 16/4404; C23C 16/455; H01L 21/67028; H01L 21/67069

USPC .......... 216/58, 37, 67; 438/905; 134/22.11, 2, 134/22.1, 22.12, 37, 42; 427/230, 237, 239, 427/248.1
See application file for complete search history.

(56) References Cited

U.S. PATENT DOCUMENTS

| 5,380,370 A * | 1/1995 | Niino et al. ................. 134/22.11 |
| 5,609,721 A * | 3/1997 | Tsukune et al. ........... 134/22.11 |

(Continued)

FOREIGN PATENT DOCUMENTS

| JP | 2000-219596 | 8/2000 |
| JP | 2009-197274 | 9/2009 |
| KR | 2003-0008228 | 1/2003 |

OTHER PUBLICATIONS

Manabe et al. (JP 2009-197274 English Machine Translation produced Jun. 19, 2015 on Proquest.com).*
International Search Report, Date of mailing: Apr. 24, 2012.

(Continued)

*Primary Examiner* — Nadine Norton
*Assistant Examiner* — Christopher Remavege
(74) *Attorney, Agent, or Firm* — Rankin, Hill & Clark LLP

(57) ABSTRACT

Provided is a method for treating the inner surface of a chlorine trifluoride supply passage that enables reliable prevention of the reduction in the concentration of $ClF_3$ in a reaction chamber during process operation.
The method includes: integrally connecting a gas supply passage (2) and a gas discharge passage (3) to a processing chamber (1) of a processing apparatus in which chlorine trifluoride is used as an etching gas; and applying chlorine trifluoride gas having a concentration equal to or higher than the concentration of chlorine trifluoride gas supplied during etching process operation on inner surfaces of at least the processing chamber (1) and the gas supply passage (2) among the processing chamber (1), the gas supply passage (2), and the gas discharge passage (3), which are integrally formed, to coat the inner surfaces of at least the processing chamber (1) and the gas supply passage (2) with a fluoride film.

2 Claims, 2 Drawing Sheets

Etching amount of Poly-Si

(56) References Cited

U.S. PATENT DOCUMENTS

| | | | |
|---|---|---|---|
| 6,290,779 B1* | 9/2001 | Saleh | C23F 1/12 134/1.1 |
| 6,929,784 B1* | 8/2005 | Bhardwaj | B01J 7/00 257/E21.218 |
| 2010/0006427 A1* | 1/2010 | Rudhard | H01J 37/32532 204/192.32 |

OTHER PUBLICATIONS

Comments in English containing English abstracts for KR 2003-0008228 and JP 2000-219596.
Singaporean application, Invitation to Respond to Written Opinion, Feb. 17, 2015.
Korean application, Office Action, Jul. 10, 2015.
Singaporean application, Written Opinion, Feb. 8, 2012.

* cited by examiner

Etching amount of Poly-Si

METHOD FOR TREATING INNER SURFACE OF CHLORINE TRIFLUORIDE SUPPLY PASSAGE IN APPARATUS USING CHLORINE TRIFLUORIDE

TECHNICAL FIELD

The present invention relates to a method for treating inner surfaces of a processing apparatus and a pipeline system connected thereto in which a coating film of fluoride is formed by exposure to chlorine trifluoride ($ClF_3$).

BACKGROUND ART

In operating a film forming operation system such as a CVD apparatus, a PVD apparatus or an epitaxial growth apparatus used in the manufacture of a semiconductor, a solar cell, a photosensitive drum or the like, $ClF_3$ is used as an etching gas.

$ClF_3$ is likely to be adsorbed to a metal, and easily causes a fluorination reaction on a metal surface. Thus, in the film forming operation system such as a CVD apparatus, a PVD apparatus or an epitaxial growth apparatus, $ClF_3$ is adsorbed to a metal constituting a device such as a reaction chamber in the apparatus or a supply passage, thereby causing a reduction in the concentration of $ClF_3$ in the reaction chamber.

Then the present applicant proposed in a prior art document (Patent Document 1) a technique to prevent the reduction in the concentration of $ClF_3$ used during a process, by constructing a gas supply passage using a metal material having a surface on which a coating film of fluoride has been formed.

PRIOR ART DOCUMENT

Patent Document

Patent Document 1: JP-A-2009-197274

SUMMARY OF THE INVENTION

Problems to be Solved by the Invention

The technique proposed in the above document is intended to construct a pipeline from a material which is preliminary coated with a fluoride film. Therefore, a welded connection part between pipes or between a pipe and a device, or a fitted connection part therebetween remains uncoated with a fluoride film, and thus $ClF_3$ is adsorbed to the part uncoated with a fluoride film, thereby failing to prevent the reduction in the concentration of $ClF_3$ in a reaction chamber.

The present invention is focused on the above points. An object of the present invention is to provide a method for treating the inner surface of a chlorine trifluoride supply passage that enables reliable prevention of the reduction in the concentration of $ClF_3$ in a reaction chamber during process operation.

Means for Solving the Problems

For achieving the above-mentioned object, the present invention in claim 1 provides a method including: integrally connecting a gas supply passage and a gas discharge passage to a processing chamber of a processing apparatus in which chlorine trifluoride is used as an etching gas; and applying chlorine trifluoride gas having a concentration equal to or higher than the concentration of chlorine trifluoride gas supplied during etching process operation on inner surfaces of at least the processing chamber and the gas supply passage among the processing chamber, the gas supply passage, and the gas discharge passage, which are integrally formed, to coat the inner surfaces of at least the processing chamber and the gas supply passage with a fluoride film, prior to the etching process using chlorine trifluoride gas.

The present invention in claim 2 provides the method according to claim 1 wherein the treatment of exposure to chlorine trifluoride gas to coat the inner surfaces of the processing chamber and the gas supply passage with a fluoride film is performed at a room temperature (20 to 30° C.).

Effect of the Invention

In the present invention, a pipe or pipes and/or a device or devices for an apparatus using chlorine trifluoride are integrally connected to each other, and then chlorine trifluoride gas having a concentration equal to or higher than the concentration of chlorine trifluoride gas during process operation is applied on inner surfaces of at least the processing chamber and the gas supply passage constituting the apparatus using chlorine trifluoride so that the inner surfaces of the processing chamber and the gas supply passage are coated with a fluoride film, prior to the etching process using chlorine trifluoride gas. Consequently, no welded connection part between pipes or between a pipe and a device, or no fitted connection part therebetween remains uncoated with a fluoride film, and thus the $ClF_3$ which is supplied during the process operation such as an etching process using $ClF_3$ is not adsorbed to a metal material constituting the pipe or chamber, resulting in reliable prevention of the reduction in the concentration of $ClF_3$ during process operation.

Further, as disclosed in claim 2, the exposure treatment to coat the inner surfaces of the processing chamber and the gas supply passage with a fluoride film is desirably performed at a room temperature (20 to 30° C.). Thereby, the inner wall surface of the pipe or chamber is prevented from undergoing heating unevenness, so that a sufficient fluoride film for preventing the reduction in concentration may be uniformly formed. The exposure treatment performed in a high temperature atmosphere of not less than 60° C. causes corrosion inside the pipe as a significant disadvantage.

MODE FOR CARRYING OUT THE INVENTION

Figure 1:
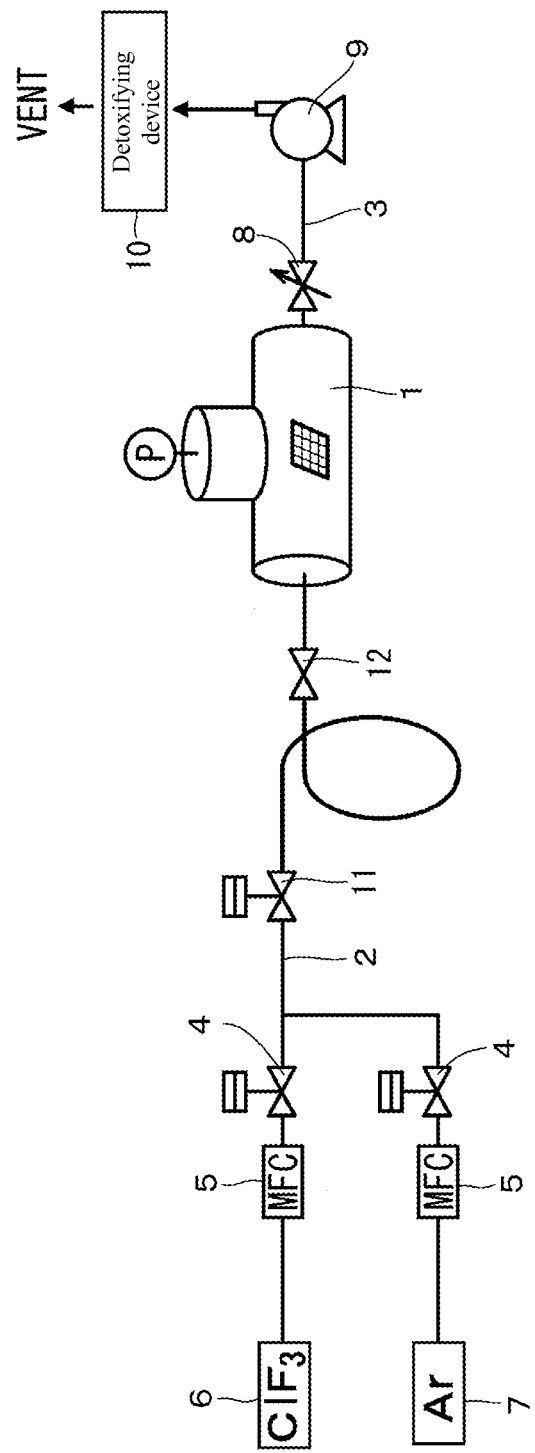
FIG. 1 is a schematic configuration showing an example of an apparatus using chlorine trifluoride to which the present invention is applied.

An embodiment of the present invention will be described with reference to a case of a semiconductor thin film manufacturing apparatus using chlorine trifluoride ($ClF_3$) as a processing gas or cleaning gas. The semiconductor thin film manufacturing apparatus includes a processing chamber (1) such as a CVD apparatus, a PVD apparatus or an epitaxial growth apparatus, a gas supply passage (2) for introducing a processing gas into the processing chamber (1), and a gas discharge passage (3) connected to the processing chamber (1) for discharging the processing gas.

The gas introducing end part of the gas supply passage (2) is branched into two. One of the branched passages is connected to a chlorine trifluoride (ClF$_3$) supply source (6) through a regulator (4) and a mass flow controller (5), and the other of the branched passages is connected to an argon gas (Ar) supply source (7) through a regulator (4) and a mass flow controller (5).

The gas discharge passage (3) connected to the processing chamber (1) is equipped with a variable flow valve (8), a vacuum pump (9), and a detoxifying device (10) in this order from the processing chamber (1) side.

For example, in a film forming operation system such as a CVD apparatus or a PVD apparatus for thin film formation used in the manufacture of a semiconductor, a solar cell or the like, a silane-based gas is used to form a Si thin film on a substrate and then ClF$_3$ gas is used for an etching process of the Si thin film.

In the present invention, prior to the etching process using ClF$_3$ gas, ClF$_3$ gas having a concentration equal to or higher than the concentration of ClF$_3$ gas during the etching process is applied on the inner surfaces of the processing chamber and the gas supply passage to make the inner surfaces coated with a fluoride film.

When, prior to the etching process using ClF$_3$ gas, ClF$_3$ gas having a concentration equal to or higher than the concentration of ClF$_3$ gas during the etching process is applied so that the inner surfaces of the processing chamber and the gas supply passage are exposed to ClF$_3$ gas to be coated with a fluoride film as described above, the inner surfaces of the pipeline system and the processing chamber are entirely coated with the fluoride film, which may therefore surely prevent the reduction in concentration during the process operation using ClF$_3$ gas caused by adsorption of the ClF$_3$ gas supplied during etching or other process operation using ClF$_3$ gas to a metal material constituting the pipe or chamber.

In this case, the treatment of exposure to ClF$_3$ gas (preliminary treatment) is preferably performed at a room temperature (20° C. to 30° C.). This prevents the inner wall surface of the pipe or chamber from undergoing heating unevenness, so that a sufficient fluoride film for preventing the reduction in concentration may be uniformly formed. The treatment of exposure to ClF$_3$ gas performed in a high temperature atmosphere of not less than 60° C. causes corrosion inside the pipe as a significant disadvantage.

EXAMPLE 1

For comparison of effects on etching processes with and without the preliminary treatment of exposure to ClF$_3$ gas, in the apparatus as shown in FIG. 1 using, as a pipe constituting the gas supply passage (2), a pipe which was subjected to the preliminary treatment of exposure to ClF$_3$ gas under the following conditions or a pipe without exposure treatment, an etching process was carried out under the following conditions on a polysilicon film-formed sample placed in the processing chamber (1). Meanwhile, the section between an air operation valve (11) and a manual valve (12) in the gas supply passage (2), which is a part mainly contributing to the reduction in the concentration of ClF$_3$ gas, has a pipe diameter of ¼" and a pipe length of 4 m (inner wall surface area of the pipe: 54,636 mm$^2$).

Conditions for the preliminary treatment of exposure to ClF$_3$ were as follows.

ClF$_3$ gas concentration: 100%
Temperature: room temperature (20° C.)

The 100% ClF$_3$ gas was kept enclosed in the processing system for 72 hours to perform the preliminary exposure to ClF$_3$.

Figure 2:
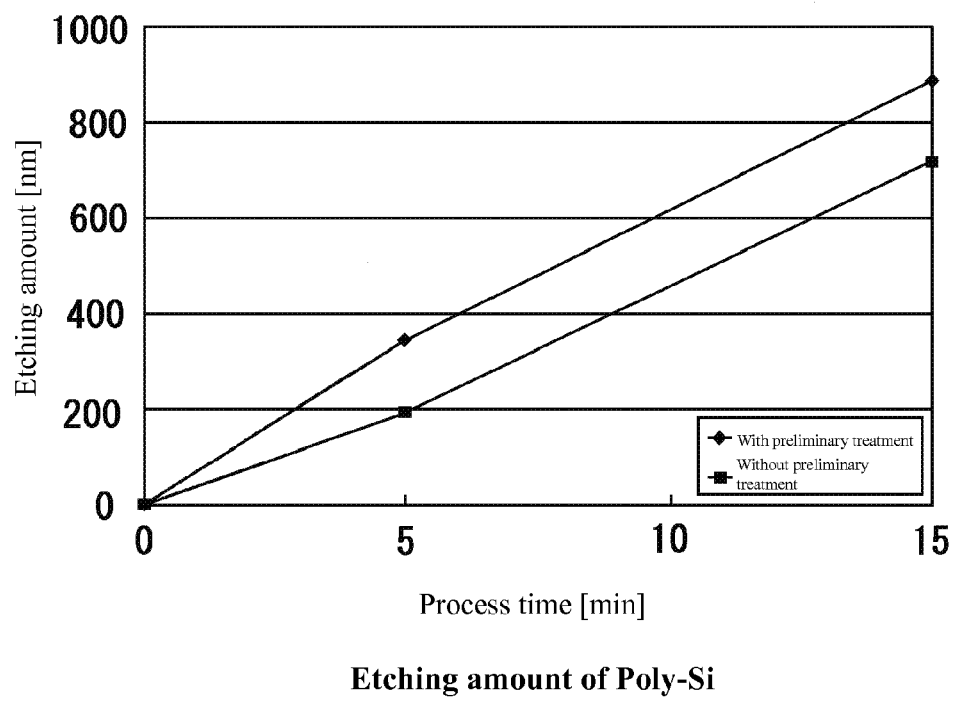
FIG. 2 is a graph showing the relationship between the process time and the etching amount.

Conditions for the etching process were as follows.
ClF$_3$ gas concentration: 500 ppm (Ar balance)
Pressure in the processing chamber (1): 500 Torr (66.7 kPa)
Temperature: room temperature (20° C.)
The results are shown in Table 1 and FIG. 2.

TABLE 1

| Etching amount of Poly-Si | | |
|---|---|---|
| ClF$_3$ preliminary treatment | Process time [min] | Etching amount [nm] |
| Performed | 5 | 345 |
|  | 15 | 892 |
| Not performed | 5 | 192 |
|  | 15 | 720 |

INDUSTRIAL APPLICABILITY

The present invention is applicable to semiconductor thin film formation in a CVD apparatus, a PVD apparatus, an epitaxial growth apparatus or others used in the manufacture of a semiconductor, a solar cell, a photosensitive drum or the like.

DESCRIPTION OF REFERENCE SIGNS

1 Processing chamber 2 Gas supply passage 3 Gas discharge passage

The invention claimed is:

1. A method for treating an inner surface in a processing apparatus using chlorine trifluoride, comprising:
   integrally connecting a gas supply passage (2) and a gas discharge passage (3) to a processing chamber (1) of a processing apparatus in which chlorine trifluoride is used as an etching gas; and
   applying chlorine trifluoride gas having a concentration equal to or higher than the concentration of chlorine trifluoride gas supplied during etching process operation on inner surfaces of at least the processing chamber (1) and the gas supply passage (2) among the processing chamber (1), the gas supply passage (2), and the gas discharge passage (3), which are integrally formed, at a temperature of 20 to 60° C., to coat the inner surfaces of at least the processing chamber (1), the gas supply passage (2) and a welded connection part between pipes or between a pipe and a device in the processing chamber (1) and the gas supply passage (2) with a fluoride film, prior to the etching process using chlorine trifluoride gas.

2. The method for treating an inner surface in an apparatus using chlorine trifluoride according to claim 1, wherein the treatment of exposure to chlorine trifluoride gas to coat the inner surfaces of the processing chamber (1) and the gas supply passage (2) with a fluoride film is performed at a room temperature atmosphere (20 to 30° C.).

* * * * *